US011653433B2

(12) United States Patent
Bassi et al.

(10) Patent No.: US 11,653,433 B2
(45) Date of Patent: *May 16, 2023

(54) MINIMUM VOLTAGE DETECTOR CIRCUIT (71) Applicant: Apple Inc., Cupertino, CA (US)

(72) Inventors: Angelo Bassi, Munich (DE); Bogdan-Eugen Matei, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/454,939

(22) Filed: Nov. 15, 2021

(65) Prior Publication Data
US 2022/0151043 A1 May 12, 2022

Related U.S. Application Data (63) Continuation of application No. 16/930,021, filed on Jul. 15, 2020, now Pat. No. 11,178,742.

(51) Int. Cl.
*H05B 45/54* (2020.01)
*H05B 45/38* (2020.01)
*G01R 31/52* (2020.01)
*G01R 31/26* (2020.01)

(52) U.S. Cl.
CPC ......... *H05B 45/54* (2020.01); *G01R 31/2635* (2013.01); *G01R 31/52* (2020.01); *H05B 45/38* (2020.01)

(58) Field of Classification Search
CPC .. H05B 37/0272; H02J 13/0017; H02J 3/005; H02J 3/00; H01H 9/54; G06F 1/26
See application file for complete search history.

(56) References Cited

U.S. PATENT DOCUMENTS

| 8,513,895 | B2 | 8/2013 | Yang et al. | |
| 8,878,445 | B2 | 11/2014 | Takata et al. | |
| 9,084,330 | B2 | 7/2015 | Wolf et al. | |
| 2009/0187925 | A1* | 7/2009 | Hu | H05B 45/46 |
| | | | | 719/327 |
| 2013/0140990 | A1 | 6/2013 | Campos et al. | |
| 2016/0088702 | A1 | 3/2016 | Gray et al. | |
| 2019/0208589 | A1* | 7/2019 | Satterfield | H05B 45/46 |
| 2020/0187323 | A1 | 6/2020 | Pamato et al. | |

OTHER PUBLICATIONS

International Search Report and Written Opinion in PCT Appl. No. PCT/US2021/038111 dated Sep. 24, 2021, 17 pages.

* cited by examiner

*Primary Examiner* — Wei (Victor) Y Chan
(74) *Attorney, Agent, or Firm* — Kowert, Hood, Munyon, Rankin & Goetzel, P.C.; Erik A. Heter; Dean M. Munyon (57) ABSTRACT A minimum voltage detector circuit is disclosed. The circuit includes a plurality of LED strings each having a plurality of series-coupled LEDs. The minimum voltage detector circuit is configured to detect a minimum voltage from among the plurality of LED strings, and also to perform open/short detection among the plurality of LED strings. The minimum voltage detector circuit includes a plurality of voltage comparators and correspondingly coupled replica circuits. Each of the voltage comparators includes an amplifier having a first input coupled to a cathode of a last LED of one of the plurality of LED strings, an output, and a second input coupled to the output. Each voltage comparator further includes a replica circuit coupled to the amplifier. The replica circuit is configured to maintain an output transistor of the amplifier in an active state when the amplifier is in an unbalanced state.

20 Claims, 7 Drawing Sheets

MINIMUM VOLTAGE DETECTOR CIRCUIT

PRIORITY CLAIM

The present application is a continuation of U.S. application Ser. No. 16/930,021, filed Jul. 15, 2020 (now U.S. Pat. No. 11,178,742), which is incorporated by reference herein in its entirety.

BACKGROUND

Technical Field

This disclosure is directed to electronic circuits, and more particularly, to circuits for detecting a minimum voltage output from a number of different circuits.

DESCRIPTION OF THE RELATED ART

Minimum voltage detection is a function that is often performed in multi-string light-emitting diode (LED) applications. Each LED string may include a number of series coupled LEDs. The LED strings may be used to, e.g., implement a backlight for a display used in various devices, such as smartphones and tablet computers. Detection of the minimum voltage may allow for greater efficiency while performing string-to-string current matching. Furthermore, detection of the minimum voltage may allow a DC-DC converter (e.g., a boost converter) to regulate a supply voltage provided to each of the LED strings.

SUMMARY

A minimum voltage detector circuit is disclosed. In one embodiment, a circuit includes a plurality of light-emitting diode (LED) strings each having a plurality of series-coupled LEDs. The circuit further includes a minimum voltage detector circuit having a plurality of voltage comparators. The minimum voltage detector circuit is configured to detect a minimum voltage from among the plurality of LED strings. The minimum voltage detector circuit includes a plurality of voltage comparators. Each of the voltage comparators includes an amplifier having a first input coupled to a cathode of a last LED of one of the plurality of LED strings, an output, and a second input coupled to the output. Each voltage comparator further includes a replica circuit coupled to the amplifier. The replica circuit is configured to maintain an output transistor of the amplifier in an active state when the amplifier is in an unbalanced state.

In one embodiment, a DC-DC converter (e.g., a boost converter) is coupled to provide a supply voltage to an anode of a first diode in each of the LED strings. The DC-DC converter further includes control circuitry coupled to receive the minimum voltage detected from the minimum voltage detector. The DC-DC converter may control the supply voltage based at least in part on the minimum voltage.

In one embodiment, a fault detection circuit may also be implemented. The fault detection circuit may be coupled to the minimum voltage detector circuit. The fault detection circuit may detect the presence of a short circuit or an open circuit in a faulty LED string.

BRIEF DESCRIPTION OF THE DRAWINGS

The following detailed description makes reference to the accompanying drawings, which are now briefly described.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f)

during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

A minimum voltage detector circuit is disclosed. Minimum voltage detection is an important function in multi-string LED applications, such as in a display backlight. Each LED string in a multi-string application may have its own LED driver circuit coupled to a cathode of a last LED in the string, from which a voltage may be detected. Due to mismatches in the diodes, the voltage from one string to the next may be different. An anode of a first diode in each LED string may be coupled to receive a supply voltage from a DC-DC converter (e.g., a boost converter). Accordingly, the voltage drops across the LED strings are not all the same when mismatches are present. The output voltage of the DC-DC converter may be regulated at least in part based on the voltages dropped by each of the LED strings. Accordingly, detection of the minimum voltage among the ends of various LED strings may be an important factor in determining the desired output voltage provided by the DC-DC converter.

In addition to detecting a minimum voltage among a number of LED strings, string diagnoses is also a desirable function. From time to time, faults may occur in one or more LEDs in an LED string. A fault may occur as a short circuit or an open circuit. In the case of an open circuit, the LED driver associated with the LED string in which the fault occurred may be shut down. In the case of a short circuit, the entirety of the backlight may be powered down.

The present disclosure contemplates a minimum voltage detection circuit and a voltage comparator circuit for implementing the same. In previous minimum voltage detection circuits, the number of LED strings for which the minimum voltage detected may be limited. Using the voltage comparator circuit disclosed herein, a minimum voltage detector may be implemented for a significantly greater number of LED strings. The circuitry implemented here may also include fault detection circuitry usable to detect faults within the LED strings.

Figure 1:
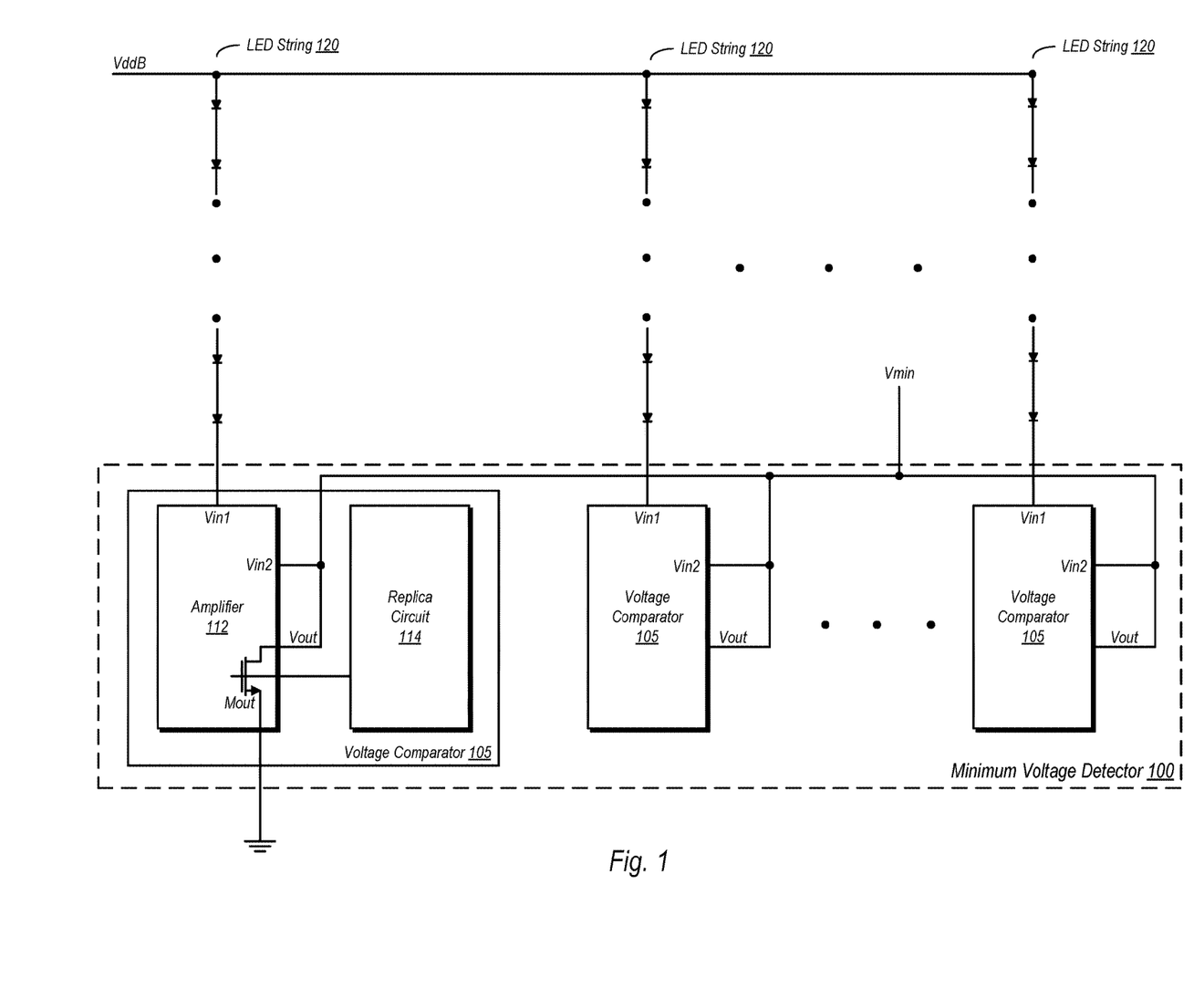
FIG. 1 is a block diagram of one embodiment of a voltage comparator circuit and its arrangement within in a minimum voltage detection circuit.

Turning now to FIG. 1, a block diagram of one embodiment of a voltage comparator circuit and its arrangement within in a minimum voltage detection circuit is shown. In the embodiment shown, each of a number of LED strings 120 include a first diode having its anode coupled to receive a supply voltage, VddB. This supply voltage may be provided from, e.g., a boost converter or more generally, a DC-DC converter, as discussed in further detail below. A cathode of a last diode in each of the LED strings is coupled to a corresponding instance of a voltage comparator 105 of minimum voltage detector 100. In particular, the cathode of the last diode in each LED string 120 is coupled to a first input, Vin1, of a corresponding one of the voltage comparators 105. The number of voltage comparators 105 implemented in minimum voltage detector 100 may vary from one embodiment to the next.

Each of the voltage comparators 105 includes an output, Vout, that is coupled to the output node of each of the other ones of the voltage comparators 205. The minimum voltage may be detected and determined on this node, which is commonly labeled as Vmin. The output node of each of the voltage comparators 105 is also coupled to a second input, Vin2, of the same comparator.

The internal arrangement of each voltage comparator 105 may correspond to that shown in the instance shown in the lower left hand corner. In particular, each voltage comparator 105 may include an amplifier 112 and a replica circuit 114. The amplifier 112 in each instance may include the first and second inputs, Vin1 and Vin2, along with the output, Vout. The amplifier in each instance may include an output transistor, Mout, with the amplifier output, Vout, taken from the drain of this device. The replica circuit 114 may ensure that the output transistor, Mout, remains on when the corresponding voltage detected on its Vin1 input is not the minimum voltage detected among the various diode strings. A more detailed implementation of a voltage comparator according to one embodiment is discussed below in reference to FIG. 2.

Since the outputs of each of the voltage comparators are coupled to one another and are further fed back to one of the inputs (Vin2), only the amplifier 112 detecting the minimum voltage on its Vin1 input will operate in a balanced fashion. The output transistor Mout of the "winning" amplifier (i.e. the amplifier with the minimum voltage on its Vin1) will sink excess current from the amplifiers 112 of the other voltage comparators 105. As a result, Vout from the winning amplifier will be the minimum voltage, Vmin, that is output from minimum voltage detector 100.

Figure 2:
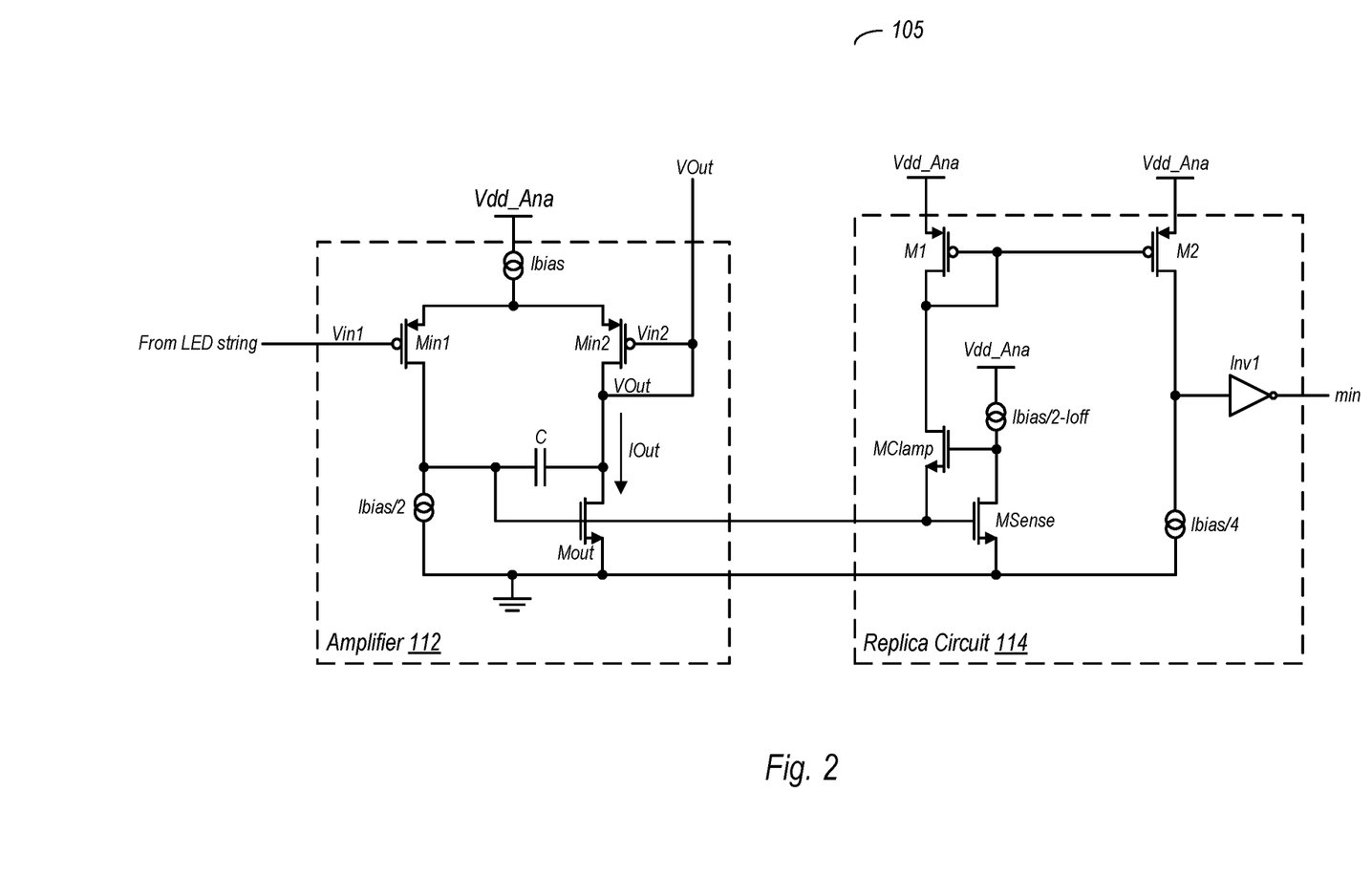
FIG. 2 is a schematic diagram of one embodiment of a voltage comparator circuit.

FIG. 2 is a schematic diagram of one embodiment of a voltage comparator circuit. In the embodiment shown, voltage comparator 105 includes an amplifier 112 and a replica circuit 114. Amplifier 112 in the embodiment shown is an operational transconductance amplifier (OTA), although the disclosure is not limited to this type of amplifier. Replica circuit 114 in the embodiment shown may detect when amplifier 112 is operating in an unbalanced manner, which may occur when the first input voltage, Vin1, is not the minimum voltage detected from among the various diode strings.

Amplifier 112 in the embodiment shown includes two input transistors, Min and Min2. The gate terminal of Min may be coupled to an LED string having a plurality of LEDs coupled in series. More particularly, Vin is an input coupled to a cathode of a last LED in the string. A second input, Vin2 on the gate terminal of Min2, is coupled to an output node, Vout, of amplifier 112. Respective source terminals of Min1 and Min2 are each coupled to receive a bias current from a bias current source, Ibias. The bias current source is coupled to receive a supply voltage, Vdd_Ana.

An output transistor, Mout, includes a drain terminal that is coupled to a drain terminal of the second input transistor, Min2. A gate terminal of Mout is coupled to a drain terminal of Min1. A capacitor C is coupled between the respective drain terminals of Min1 and Min2. A second current source, Ibias/2, is coupled between the drain terminal of Min1 and a ground node. The output transistor, meanwhile, sinks an output current, Iout. When operation of amplifier 112 is balanced, the output current, Tout, is equal to the current through current source Ibias/2. In other words, during balanced operation, each leg of amplifier 112 sinks one half of the bias current, Ibias, which occurs when the inputs are equal. This condition could also occur if only a single comparator were connected to amplifier 112.

The output voltage from the amplifier is taken from the drain terminal of Mout. This output voltage is also fed back to amplifier 112, and in particular, to the Vin2 input on the gate terminal of Min2.

Replica circuit 114 in the embodiment shown includes a sense transistor, MSense. The gate terminal of MSense is coupled to the gate terminal of MOut in amplifier 112, as well as the drain terminal of Min1. A drain terminal of MSense is coupled to a current source, Ibias/2-Ioff. The current Ioff corresponds to an amount of an offset current needed to ensure the replica circuit is turned off when the amplifier is balanced. This current may be sized to cover a worst case process mismatch between the source of Ibias/2 and Iout., which in turn is coupled to receive a supply voltage from Vdd_Ana. In the embodiment shown, MSense is a replica of Mout, being substantially the same size and having substantially the same operating characteristics.

Transistor MClamp includes a gate terminal coupled to the drain terminal of MSense, with the source terminal of MClamp being coupled to the gate terminal of Mout. A drain terminal of MClamp is coupled to a drain terminal of M1, which is diode-coupled in the embodiment shown. The respective gate terminals of M1 and M2 are coupled to one another, and thus form a current mirror. The drain terminal of M2 is coupled to another current source, Ibias/4. An inverter, Inv1, includes an input terminal coupled to the drain terminal of M2. When the output from inverter Inv1, 'min', is asserted, voltage comparator 105 is providing an indication it is the comparator that is detecting the minimum voltage.

When Vin1 is not the minimum voltage detected among a number of voltage comparators 105, amplifier 112 is unbalanced in operation. This is due to the fact that the gate voltage Vin1 on transistor Min1 is different than the gate voltage on Vin2, which is coupled to Vout and thus to the output nodes of the other comparators 105 (and thus lower). When unbalanced due to Vin1 being greater than Vin2, a lower amount of current is sunk through the left branch of amplifier 112 relative to the right branch. As a result, the gate voltage on Mout, and thus on Msense, falls. As a result, Msense sinks less current, and thus the voltage on its drain terminal rises. Correspondingly, the voltage on the gate terminal of MClamp rises. When the gate voltage of Mout/MSense falls while the gate voltage of MClamp rises, the gate-source voltage of the latter device may exceed its threshold voltage. When the gate-source voltage of MClamp exceeds its threshold voltage, the device is turned on. Since the source terminal is coupled to the respective gate terminals of Mout and Msense, the gate voltages of the latter two devices are prevented from falling to zero. Accordingly, transistor Mout remains turned on, conducting a small amount of current, even though amplifier 112 is unbalanced (e.g., operating in a lower portion of its linear region).

Since replica circuit 114 as described herein causes MOut to remain on and sinking a small amount of current even when amplifier 112 is unbalanced, the transistors used to implement MOut may be smaller than embodiments in which no replica circuit is provided. In the absence of replica circuit 114, the gate-source voltage of Mout would fall to zero, and thus the device would turn off. This would result in a longer time to turn on in the event that the operation changed from unbalanced to balanced. Furthermore, in embodiments in which only the amplifier is present (e.g., no replica circuit), transistor Mout sinks the bias current from the amplifiers of the other voltage comparators. This in turn would require a larger device to implement Mout, and would further increase the turn on time. However, since Mout in the embodiment of FIG. 2 does not turn off when amplifier 112 is unbalanced (due to the operation of the clamp transistor, MClamp), Mout of the winning cell does not need to sink the entire bias current from all other cells. Accordingly, Mout in the embodiment of FIG. 2 can be implemented with a smaller device. Furthermore, since Mout does not completely turn off, transitioning from unbalanced to balanced operation may occur faster relative to similar circuits in which Mout is turned off when unbalanced operation occurs.

When Vin1 is the minimum voltage detected among a number of voltage comparators 105, amplifier 112 may be balanced in operation, as Vin1=Vin2=Vout. The current through both branches of amplifier 112 during balanced operation is substantially equal (e.g., the currents through transistors Min1 and Min2 are equal). In addition to the substantially equal currents in both branches, the gate voltage on Mout, and thus Msense, is higher, with the source voltage of MClamp being higher as a result. Thus, with MSense sinking a greater amount of current, its drain voltage, and thus the gate voltage of MClamp, is lower. Therefore, the gate-source voltage of MClamp is less than its threshold voltage, and this device remains off. While amplifier 112 and replica circuit 114 illustrate the use of transistors M1, M2, Min1, Min2, one of ordinary skill in the art will recognize that one or more of these transistors may be replaced by another type of switching device.

Figure 3:
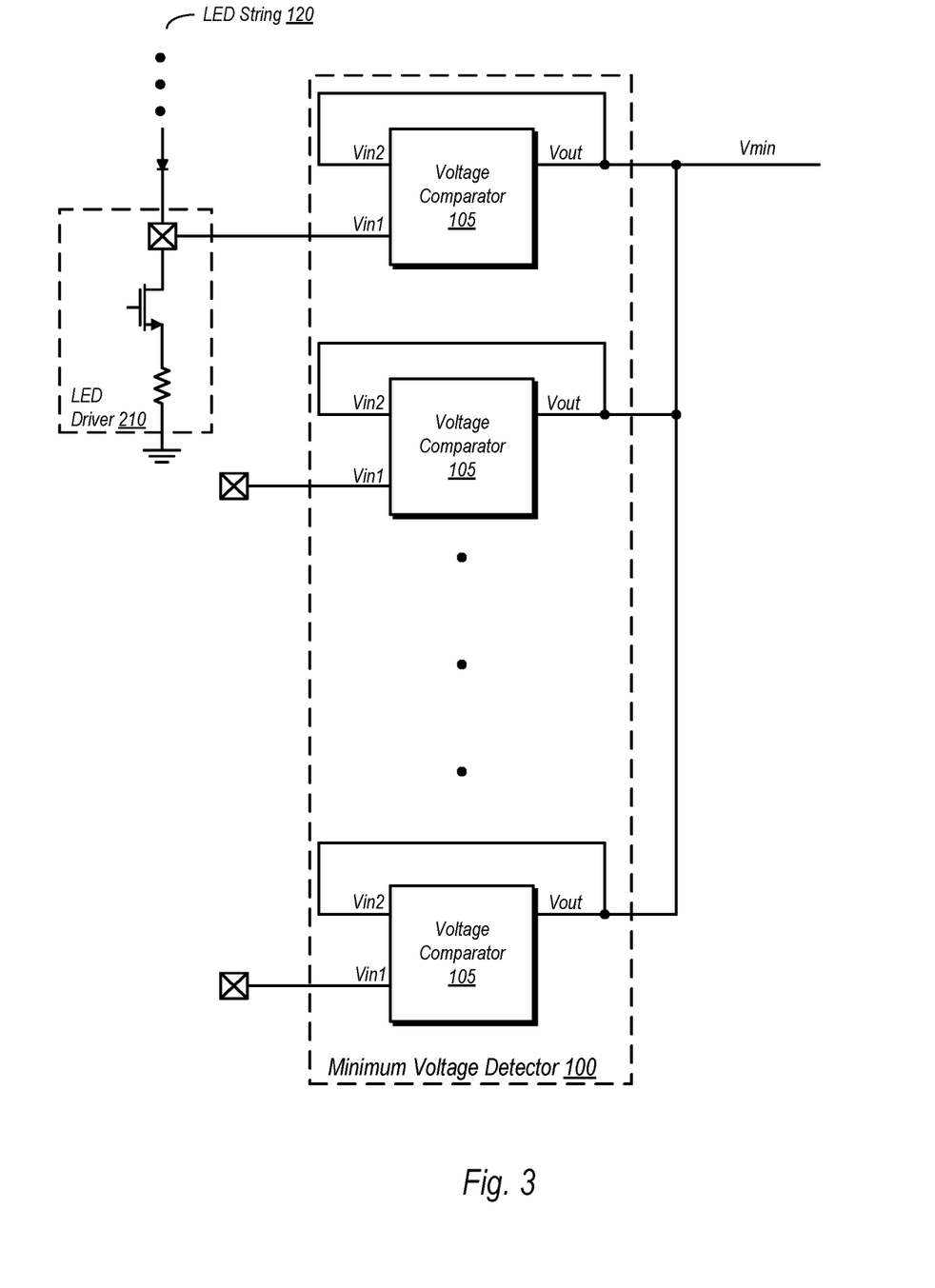
FIG. 3 is a diagram illustrating one embodiment of a minimum voltage detection circuit.

FIG. 3 is a diagram illustrating one embodiment of a minimum voltage detection circuit. More particularly, FIG. 3 illustrates the connection of the LED strings 120, LED drivers 210, and voltage comparators 105.

As shown in FIG. 3, minimum voltage detector 100 includes a number of voltage comparators 105. Each of the voltage comparators 105 includes an output node, Vout, which is coupled to the corresponding output node of every other voltage comparators 105 implemented in minimum voltage detector 100. In each instance of a voltage comparator 105, the output node, Vout, is coupled to one of the input nodes, Vin2. This arrangement corresponds to that which is illustrated in FIG. 2.

Each of the voltage comparators 105 includes another input node, Vin1. Each of these input nodes is coupled to a corresponding LED string 120 (although only one is shown here for the sake of simplicity). More particularly, the Vin1 node is coupled to a cathode of a last diode in the LED string 120. An LED driver circuit 210 is also coupled to the input node Vin1. The LED driver circuit 210 may, through various operational modes, control the illumination of the LEDs in its correspondingly coupled LED string 120. For full brightness, the LED driver circuit 210 may operate with the illustrated transistor continuously turned on (this may be referred to as the continuous mode of operation). For reduced brightness, the LED driver circuit 210 may operate in a pulse width modulation (PWM) mode. Operation in the PWM mode includes turning the transistor on and off for various amounts of time (thereby modulating the width of current pulses drawn through LED string 120), and may be used to reduce the apparent brightness of the LEDs in LED string 120.

It is noted that the LED driver circuit 210 shown in FIG. 3 is a simplified example. Any suitable embodiment of an LED driver circuit may be used, including embodiments that are more complex than the example shown here.

Figure 4:
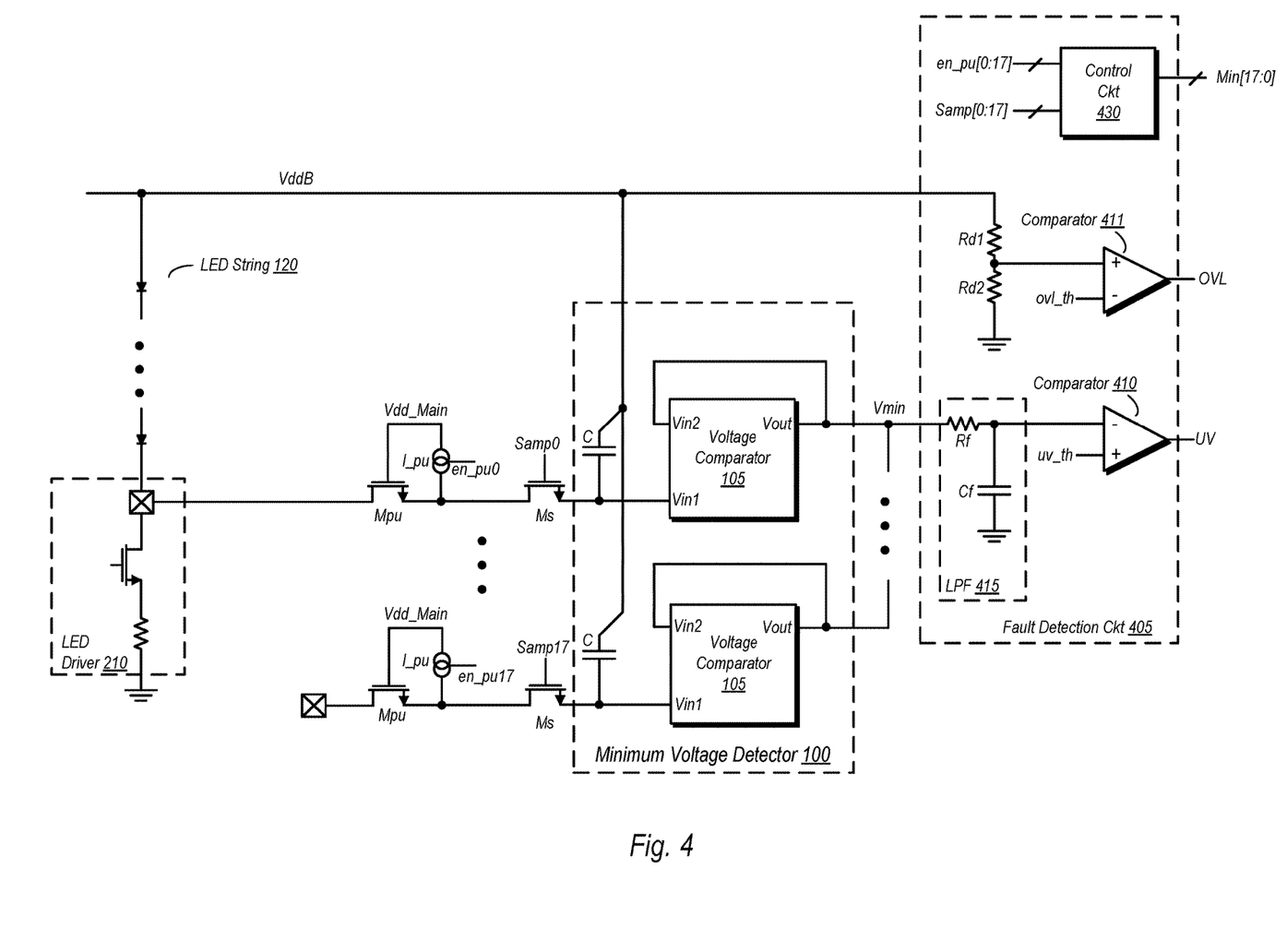
FIG. 4 is a schematic diagram illustrating one embodiment of a fault detection circuit.

FIG. 4 is a schematic diagram illustrating one embodiment of a fault detection circuit. In the embodiment shown, fault detection circuit 405 includes comparators 410 and 411, a control circuit 430, a low pass filter 415 (including resistor Rf and capacitor Cf), and a voltage divider including resistors Rd1 and Rd2. The low pass filter 415 provides minimum voltage buffering and smooths the transient response of the minimum voltage detector 100 when the minimum input changes (e.g., the minimum voltage changes from being detected by one comparator 105 to another). Comparator 411 includes a first input coupled to the junction of Rd1 and Rd2, and a second input coupled to receive a threshold voltage ovl_th. Comparator 410 is coupled to receive, on one input, the output of the low pass filter 415, which in turn is coupled to the Vmin output of minimum voltage detector 100. The other input of comparator 410 is coupled to receive another threshold voltage, uv_th.

Detection of a fault and the triggering of a check for opens and shorts in an LED string 120 is triggered when the output of comparator 411 OVL=1 and the output of comparator 410, UV=1. The OVL=1 condition occurs when the voltage at the junction of Rd1 and Rd2 exceeds that of the threshold voltage ovl_th. The UV=1 condition occurs when the voltage output from the low pass filter 415 (which receives Vmin as its input) is less than a threshold voltage.

When both OVL=1 and UV=1, the presence of a fault is indicated. However, the nature of the fault, open circuit or short circuit, is unknown upon initial detection. The OVL and UV signals may be provided to control circuit 430, as well as to an external destination.

Determination of whether the fault is a short or an open may be performed as follows. When either a short circuit or open circuit occurs in a diode string, its voltage will be zero on the input to its corresponding voltage comparator 105. The voltage comparator 105 detecting the zero minimum voltage may thus provide an indication to control circuit 430, e.g., through a corresponding one of signals Min[17:0] (which corresponds to the 'min' signal output from an instance of replica circuit 114, as shown in FIG. 2). Upon determining that a short or open is present, control circuit 430 may generate control signals to isolate the fault and determine whether the fault is an open or short.

Control circuit 430 in the embodiment shown may assert an enable signal and a sample signal corresponding to the LED string 120 indicated as faulty. Since the voltage is either zero or very low on the cathode of the last diode of the faulty LED string 120 (and thus passing through the pass-gate transistor Mpu), the input to the corresponding voltage comparator 105 needs to be pulled high. This is accomplished via the corresponding current source I_pu. The enable signal may be provided to a current source I_pu (e.g., en_pu0 to the first instance of I_pu as shown in FIG. 4). Meanwhile, the corresponding sample transistor, Ms may be activated. Thus, when on, the current source I_pu attempts to pull high the Vin input of the corresponding voltage comparator 105.

With the current source I_pu attempting to pull up the Vin input of the corresponding comparator, an output of UV=1 from comparator 410 indicates the presences of a short circuit. This is due to the output of the corresponding voltage comparator Vout, and thus the output from low pass filter 415, being zero or a very low voltage that is less than the threshold uv_th. The short circuit condition in this case prevents the input voltage Vin to the corresponding voltage comparator 105 being pulled sufficiently high to raise the output voltage to a point wherein the low pass filter output can exceed the threshold voltage.

If the output of comparator 410 is UV=0 when current source I_pu attempting to pull up the Vin input of the corresponding comparator, the fault detection circuit 405 is indicating the presence of an open circuit. When UV=0, the voltage on Vmin is sufficiently high that the output of low pass filter 415 exceeds the threshold voltage uv_th. This indicates that the current source I_pu is able to successfully pull up the Vin1 input of the corresponding voltage comparator, which is possible when an open circuit is present but not possible for a short circuit.

Responsive to detecting a fault and determining whether the fault is a short circuit or an open circuit, various actions may be taken. If the fault is an open circuit, LED driver circuit 210 for the corresponding LED string 120 may be shut down, while the corresponding voltage comparator may be isolated via by turning off the corresponding sample transistor Ms.

Figure 5:
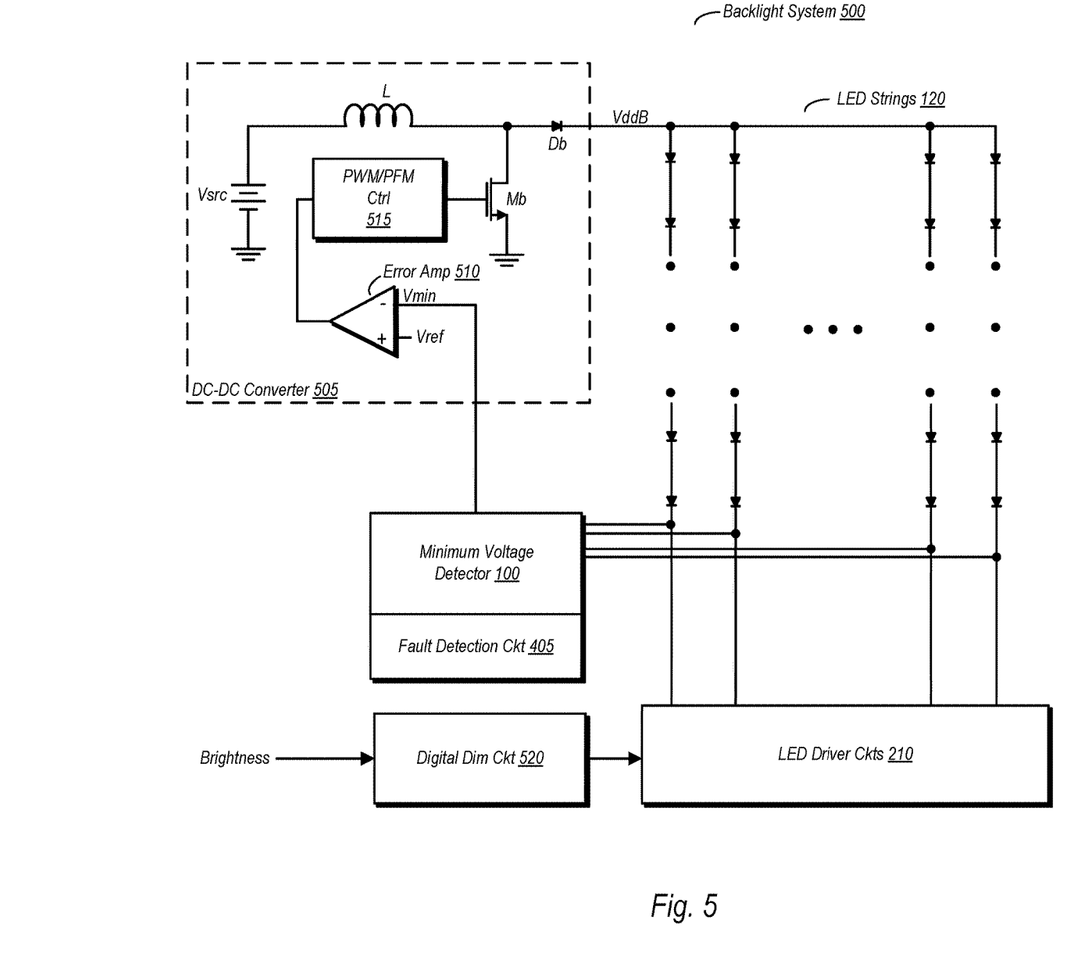
FIG. 5 diagram illustrating one embodiment of a backlight system having a number of LED strings and a DC-DC converter.

FIG. 5 diagram illustrating one embodiment of a backlight system having a number of LED strings and a DC-DC converter. In the embodiment shown, backlight system 500 includes a DC-DC converter 505, a number of LED strings 120, a minimum voltage detector circuit 100, a fault detection circuit 405 (which may operate in accordance with the discussion above), a digital dimming circuit 520, and a number of LED driver circuits 210 (shown here as a single block for simplicity).

Digital dimming circuit 520 in the embodiment shown is arranged to control the LED driver circuits 210. Among the control functions performed by digital dimming circuit 520 is controlling the mode of operation of the various LED driver circuits 210 (e.g., PWM or continuous mode). Other inputs to digital trim circuit 520 may include an indication of a desired brightness (e.g., the "Brightness" input). The digital dimming circuit 520 may generate one or more control signals provided to LED driver circuits to control the mode of operation and the brightness of the backlight.

DC-DC converter 505 in the embodiment shown is configured to provide a supply voltage VddB to the anode of a first LED in each of the LED strings 120. In this particular embodiment, DC-DC converter 505 is a boost converter configured to output the supply voltage VddB at a value greater than the source input voltage Vsrc. The source voltage is provided to a first terminal of an inductor L, while a second terminal of the inductor L is coupled to a drain terminal of transistor Mb. Transistor Mb in the embodiment shown is switched off and on by PWM/PFM control circuit 515. Accordingly, transistor Mb may be switched in accordance with a PWM mode, or a PFM (pulse frequency modulation mode). The voltage on the junction Mb and inductor L is conveyed to the anode of diode Db, which outputs the supply voltage VddB.

Error amplifier 510 in the embodiment shown is coupled to receive the minimum voltage, Vmin, from the minimum voltage detector 100. The error amplifier 510 may also receive a reference voltage, Vref. Based on a difference between the minimum voltage, Vmin, and the reference voltage, Vref, error amplifier 510 may generate an error signal that is input in PWM/PFM control circuit 515. Based on the error signal, PWM/PFM 515 may adjust the switching of transistor Mb to cause DC-DC converter 505 to provide a desired value of output voltage VddB.

Various embodiments of the minimum voltage detector circuit discussed above may provide certain advantages over previous minimum voltage detectors. Using various embodiments of the circuitry disclosed herein, a minimum voltage detector may be implemented for a larger number of LED strings than previous embodiments. For example, while previous minimum voltage detectors may be limited to, e.g., 8 LED strings, the minimum voltage detector disclosed herein may be implemented for a significantly larger number (e.g., 18) LED strings. The die area consumed by these circuits may also be reduced on a per-comparator basis, since the output transistor (Mout) of the various embodiments discussed above may be implemented using a smaller device relative to those in which no replica circuit is provided. Meanwhile, the operation of the replica circuit, which keeps the output transistor of the amplifier turned on even when unbalanced allows for faster changes between balanced and unbalanced operation due to the minimum voltage changing from one LED string to the next.

Figure 6:
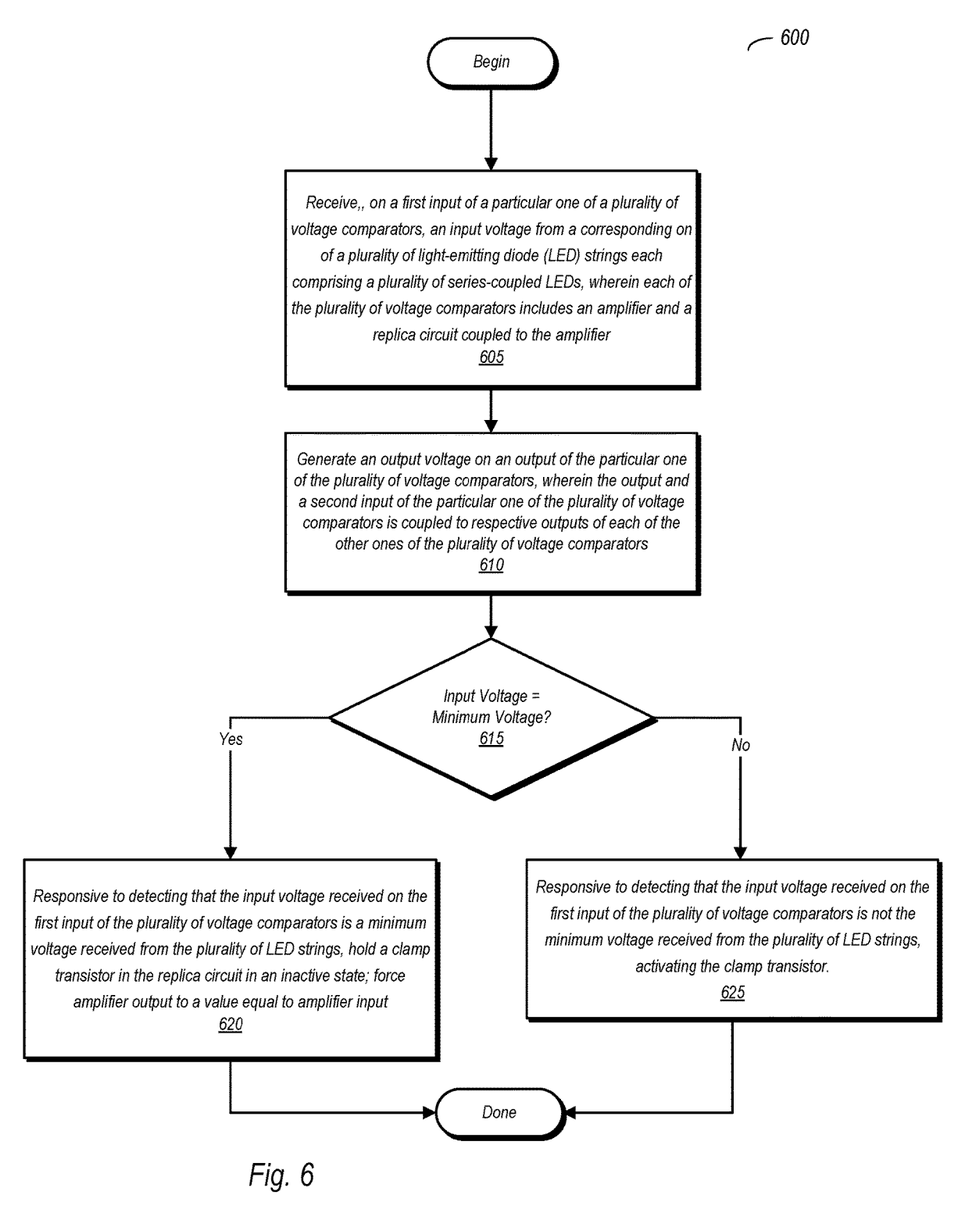
FIG. 6 is a flow diagram illustrating one embodiment of a method for operating a voltage comparator circuit.

FIG. 6 is a flow diagram illustrating one embodiment of a method for operating a voltage comparator circuit. The voltage comparator circuit discussed herein may be any embodiment of that which is discussed above, and may be implemented in a minimum voltage detector circuit. Embodiments of a voltage comparator circuit not explicitly discussed herein but capable of carrying out the functions discussed below may fall within the scope of this disclosure.

Method 600 begins with receiving, on a first input of a particular one of a plurality of voltage comparators, an input voltage from a corresponding on of a plurality of light-emitting diode (LED) strings each comprising a plurality of series-coupled LEDs, wherein each of the plurality of voltage comparators includes an amplifier and a replica circuit coupled to the amplifier (block 605). The method further includes generating an output voltage on an output of the particular one of the plurality of voltage comparators, wherein the output and a second input of the particular one of the plurality of voltage comparators is coupled to respective outputs of each of the other ones of the plurality of voltage comparators (block 610). When implemented in a minimum voltage detection circuit, the voltage on an input of the circuit may be the minimum voltage of call comparators (block 615, yes), or may be above the minimum voltage (block 615, no). Responsive to detecting that the input voltage received on the first input of the plurality of voltage comparators is a minimum voltage received from the plurality of LED strings, the method includes holding a clamp transistor in the replica circuit in an inactive state (block 620). Additionally, the output of the amplifier is forced to a value equal to the input. Responsive to detecting that the input voltage received on the first input of the plurality of voltage comparators is not the minimum voltage received from the plurality of LED strings, the method includes activating the clamp transistor (block 625).

In various embodiments, detecting that the input voltage received on the first input of the plurality of voltage comparators is a minimum voltage received from the plurality of LED strings comprises determining that the amplifier is in a balanced state. Detecting that the input voltage received on the first input of the plurality of voltage comparators is not the minimum voltage received from the plurality of LED strings comprises determining that the amplifier is in an unbalanced state. The particular one of the plurality of voltage comparators may also provide an indication responsive to detecting that the input voltage received on the first input of the plurality of voltage comparators is the minimum voltage received from the plurality of LED strings.

In various embodiments, the method includes detecting presence of a circuit fault in one of the LED strings based on an output voltage from a corresponding one of the plurality of voltage detectors. The method may also include determining whether the circuit fault is a short circuit or an open circuit. The method may further include a DC-DC converter providing a supply voltage to an anode of a first LED in each of the plurality of LED strings and the DC-DC converter adjusting the supply voltage based on the minimum voltage received from the plurality of LED strings.

Figure 7:
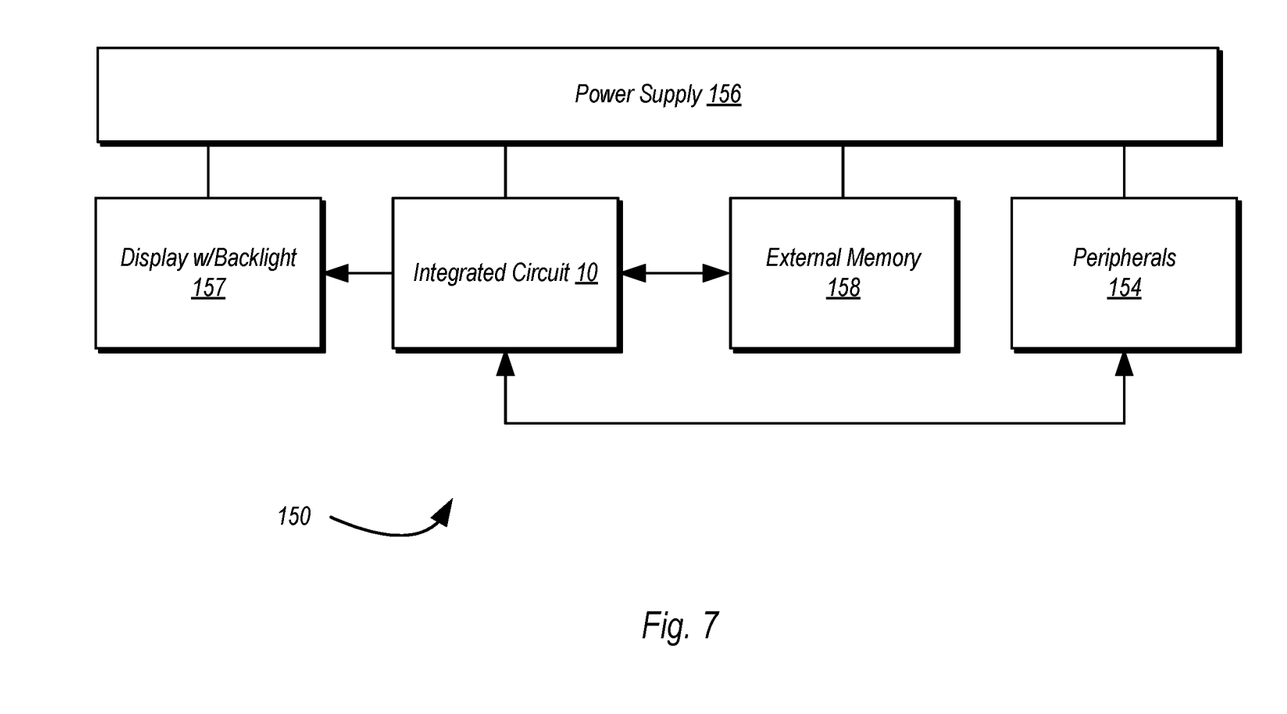
FIG. 7 is a block diagram of one embodiment of an example system.

Turning next to FIG. 7, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

System 150 in the embodiment shown also includes at least one instance of a display 157, the display including a backlight. The backlight of display 157 may be implemented using a number of LED strings, each of which is coupled to a minimum voltage detection circuit as discussed above. The minimum voltage detection circuit may utilize various embodiments of the voltage comparator circuit discussed above. Fault detection as discussed above may also be implemented.

Numerous variations and modifications will become apparent to those skilled in the art once the above disclosure is fully appreciated. It is intended that the following claims be interpreted to embrace all such variations and modifications.

What is claimed is:

1. A circuit comprising:
   a minimum voltage detector circuit configured to detect a minimum voltage from among a plurality of voltage nodes, wherein the minimum voltage detector circuit includes a plurality of voltage comparators, wherein ones of the voltage comparators include:
      an amplifier having a first input coupled to a corresponding one of the plurality of voltage nodes, an output, and a second input coupled to the output; and
      a replica circuit coupled to the amplifier, wherein the replica circuit is configured to maintain an output device of the amplifier in an active state when the amplifier is in an unbalanced state.

2. The circuit as recited in claim 1, wherein the replica circuit includes a sense device configured to sink an amount of current corresponding to an amount of current passing through the output device.

3. The circuit of claim 2, wherein the replica circuit further includes a clamp device, wherein the sense device is configured to cause activation of the clamp device in response to the amount of current passing through the output device being less than a threshold value, and further configured to cause deactivation of the clamp device in response to the amount of current falling through the output device exceeding the threshold value.

4. The circuit of claim 1, further comprising a power converter configured to adjust a regulated supply voltage based on the minimum voltage.

5. The circuit of claim 4, wherein the power converter includes an error amplifier configured to generate an error signal based on a difference between the minimum voltage and a reference voltage.

6. The circuit of claim 4, wherein the power converter is a boost converter.

7. The circuit of claim 1, further comprising a fault detection circuit coupled to ones of the plurality of voltage comparators, wherein the fault detection circuit is configured detect short circuits and open circuits associated with ones of plurality of voltage nodes.

8. The circuit of claim 7, wherein the fault detection circuit includes:
   a first comparison circuit configured to generate a first fault detection signal based on a comparison of the minimum voltage and a first threshold voltage;
   a second comparison circuit configured to generate a second fault detection signal based on a comparison of a divider voltage and a second threshold;
   wherein the fault detection circuit is configured to indicate that a fault is present based on assertion of the first and second fault detection signals.

9. The circuit of claim 8, further comprising sampling circuitry configured to isolate a particular one of the plurality of voltage comparators, wherein the fault detection circuit is further configured to determine whether a fault associated with respective voltage node coupled the particular one of the plurality of voltage comparators is a short circuit or an open circuit.

10. The circuit of claim 1, wherein the amplifier of ones of the plurality of voltage comparators is an operational transconductance amplifier, and wherein the operational transconductance amplifier of a particular one of the plurality of voltage comparators is configured to operate as in the unbalanced state when a correspondingly coupled voltage node is associated with the minimum voltage.

11. A method comprising:
   detecting, using a minimum voltage detector circuit, a minimum voltage from among a plurality of voltage nodes, wherein detecting the minimum voltage comprises:
      receiving respective input voltages, in respective amplifiers of a plurality of voltage comparators coupled to corresponding ones of the of the plurality of voltage nodes; and
      operating a respective amplifiers of a particular one of the plurality of voltage comparators in an unbalanced state in response to its respective input voltage being the minimum voltage, wherein operating the respective amplifier in the unbalanced state comprises a replica circuit maintaining an output device of the respective amplifier in an active state.

12. The method of claim 11, further comprising:
   sinking, using a sense device of the replica circuit, an amount of current corresponding to an amount of current passing through the output device;
   activating a clamp device of the replica circuit in response to the amount of current passing through the output device being less than a threshold value; and
   deactivating the clamp device in response to the amount of current passing through the output device exceeding the threshold value.

13. The method of claim 11, further comprising adjusting, based on the minimum voltage, a supply voltage provided by a power converter.

14. The method of claim 11, further comprising fault detection circuit detecting a fault associated with one or more of the plurality of voltage comparators.

15. The method of claim 14, further comprising:
   generating, using a first comparison circuit, a first fault detection signal based on a comparison of the minimum voltage and a first threshold voltage; and
   generating, using a second comparison circuit, generate a second fault detection signal based on a comparison of a divider voltage and a second threshold;
   wherein assertion of the first and second fault detection signals indicate presence of a fault in at least one of the plurality of voltage comparators.

16. The method of claim 15, further comprising:
isolating, using sampling circuitry, the particular one of the plurality of voltage comparators; and
determining whether a fault associated with the particular one of the plurality of voltage comparators is a short circuit or an open circuit based on the isolating.

17. An apparatus comprising:
a plurality of light emitting diode (LED) strings, wherein ones of the plurality of LED strings include a corresponding one of a plurality of voltage nodes at respective cathodes of a final LED of their corresponding LED string;
a minimum voltage detector circuit configured to detect a minimum voltage from among the plurality of voltage nodes, wherein the minimum voltage detector circuit includes a plurality of voltage comparators, wherein ones of the plurality of voltage comparators include:
an amplifier coupled to receive, as an input, a voltage from a correspondingly coupled one of the plurality of voltage nodes, wherein the amplifier is configured to operate in an unbalanced state if a voltage on the correspondingly coupled one of the plurality of voltage nodes is the minimum voltage, and further configured to operate in a balanced state if the voltage on the correspondingly coupled one of the plurality of voltage nodes is not the minimum voltage; and
a replica circuit configured maintain an output device of the amplifier in an active state when the amplifier is operating in an unbalanced state.

18. The apparatus of claim 17, wherein the replica circuit includes:
a sense device configured to sink an amount of current corresponding to an amount of current passing through the output device;
a clamp device, wherein the sense device is configured to cause activation of the clamp device in response to the amount of current passing through the output device being less than a threshold value, and further configured to cause deactivation of the clamp device in response to the amount of current falling through the output device exceeding the threshold value.

19. The apparatus of claim 17, further comprising a power converter configured to provide a supply voltage to the plurality of LED strings, and further configured to adjust the supply voltage based on the minimum voltage based on an error signal generated by an error amplifier coupled to receive the minimum voltage.

20. The apparatus of claim 17, further comprising a fault detection circuit coupled to ones of the plurality of voltage comparators and configured detect short circuits and open circuits associated with ones of plurality of voltage nodes.

* * * * *